(12) United States Patent
Watanabe et al.

(10) Patent No.: US 6,391,229 B1
(45) Date of Patent: May 21, 2002

(54) BORATE CRYSTAL, GROWTH METHOD OF THE SAME AND LASER EQUIPMENT USING THE SAME

(75) Inventors: Noriko Watanabe; Tamotsu Sugawara; Genta Masada; Hiroyuki Shiraishi; Yasuhiro Hanaue, all of Omiya; Ryuichi Komatsu, Ube; Tsuyoshi Kajitani; Yasuhiro Ono, both of Sendai, all of (JP)

(73) Assignee: Mitsubishi Materials Corporation, Tokyo (JP)

(*) Notice: Subject to any disclaimer, the term of this patent is extended or adjusted under 35 U.S.C. 154(b) by 0 days.

(21) Appl. No.: 09/476,086

(22) Filed: Jan. 3, 2000

(30) Foreign Application Priority Data

Jan. 7, 1999 (JP) .............................. 11-001682
Dec. 17, 1999 (JP) .............................. 11-358411

(51) Int. Cl.⁷ .......................... G02B 5/20; C01B 15/12; H01S 3/10
(52) U.S. Cl. .................. 252/584; 252/582; 423/277; 423/279; 372/21; 372/22; 117/73
(58) Field of Search ............................. 252/584, 582; 423/277, 279; 372/21, 22; 117/73

(56) References Cited

U.S. PATENT DOCUMENTS

| 5,390,211 A | * | 2/1995 | Clark et al. .................. 372/22 |
| 5,684,813 A | * | 11/1997 | Keszler ........................ 372/21 |
| 5,998,313 A | * | 12/1999 | Sasaki et al. ............... 423/277 |
| 6,002,697 A | * | 12/1999 | Govorkov et al. ............ 372/22 |
| 6,198,756 B1 | * | 3/2001 | Caprara ........................ 372/22 |

* cited by examiner

*Primary Examiner*—Philip Tucker
(74) *Attorney, Agent, or Firm*—Oblon, Spivak, McClelland, Maier & Neustadt, P.C.

(57) ABSTRACT

A borate single crystal which can stably perform light wavelength conversion with high efficiency down to the ultraviolet region is represented by the chemical formula $(A_2O) \cdot (B_2O_3)_x$, and is an orthorhombic crystal belonging to the $P2_12_12_1$ space group, wherein A includes two elements selected from the group consisting of Li, Na, K, Rb, and Cs, and $1.5 < x < 2.5$.

12 Claims, 8 Drawing Sheets

BORATE CRYSTAL, GROWTH METHOD OF THE SAME AND LASER EQUIPMENT USING THE SAME

TECHNICAL FIELD

The present invention relates to a borate single crystal and a method for growing the same, in which the single crystal has noncentrosymmetry, is transparent in a region from ultraviolet light of 200 nm or less to infrared light of 2,000 nm or more, and is used in fields which require nonlinear optical effects, electrooptical effects, and acoustooptical effects. In particular, the present invention relates to a laser device using the single crystal in the ultraviolet region and a processing apparatus using the laser device.

BACKGROUND ART

Single-crystal materials have been used in a wide range of fields in order to fully utilize functions due to the crystal structure thereof. In particular, single-crystal materials as optical materials can avoid scattering at grain boundaries and thus have a wide range of uses. Among these, materials having crystal structures which do not have centrosymmetry exhibit optical nonlinearity, in addition to piezoelectricity and pyroelectricity, and are important as light wavelength converters.

There is an increasing demand for ultraviolet laser light in microprocessing fields. Excimer lasers are currently used as practical ultraviolet lasers. However, these utilize toxic gases, and it is difficult to increase the pulse repetition rate. Thus, solid-state lasers using wavelength converters have been increasingly in demand.

Many materials are known as light wavelength converters. However, only a few materials, such as LBO ($LiB_3O_5$), BBO ($\beta\text{-}BaB_2O_4$), and KDP ($KH_2PO_4$) are known for use in consideration of generation of ultraviolet light. Among them, LBO is suitable for the YAG third harmonic wave (355 nm), but is not suitable for shorter wavelengths due to refractive index characteristics. BBO has a high conversion efficiency, but has a significantly small tolerance of the phase-matching angle. Since BBO and KDP show slight absorption of ultraviolet light, these can only output stable powers of at most 500 mW when used for generation of the YAG fourth harmonic wave (266 nm).

In such circumstances, there is a strong demand for new types of crystals. In particular, borate single crystals have attracted attention since these generally have broad transmittance characteristics down to the ultraviolet region and have a considerably large nonlinear optical constant due to conjugated π electrons ("Optical Crystals", pp. 321 to 326, published by Baifukan (1995); and Takatomo Sasaki, "Current Status and Future Development in Borate Nonlinear Optical Crystals", The Review of Laser Engineering, 26(3), p. 215 (1998)). As an example, a cesium lithium borate crystal, CLBO ($CsLiB_6O_{10}$), is proposed (Japanese Patent Application Laid-Open No. Hei 8-91997). This crystal has a nonlinear optical constant which is substantially equal to that of the LBO crystal. This crystal, however, is strongly hygroscopic and is thus deliquescent causing spontaneous cracking. As a result, it is difficult to produce high-quality crystals at industrial scales, and this crystal is not used in practice.

To solve such problems, crystals represented by a composition in which Rb, K or Tl are partly or entirely substituted for Cs in the CLBO crystal is proposed (Japanese Patent Application Laid-Open No. Hei 8-295507). Among these, RLBO ($RbLiB_6O_{10}$) in which Rb is entirely substituted for Cs can be readily produced and is very safe.

The present applicant filed a patent application for a light wavelength-converting element composed of an LB4 ($Li_2B_4O_7$) crystal which has high moisture resistance and which can be used in a high-power range (Japanese Patent Application Laid-Open No. Hei 9-281535).

This RLBO crystal is also hygroscopic, that is, it absorbs moisture, resulting in deterioration of light wavelength conversion efficiency.

On the other hand, the LB4 crystal has problems in that it has a low nonlinear optical constant and a significantly low light wavelength conversion efficiency.

It is an object of the present invention to provide a borate single crystal capable of stable light wavelength conversion with high efficiency down to the ultraviolet region and having high moisture resistance.

It is another object of the present invention to provide a method for growing a borate single crystal.

It is still another object of the present invention to provide a laser device using the borate single crystal and a processing apparatus using the laser device.

DISCLOSURE OF INVENTION

The present inventors have searched a crystal having excellent optical characteristics similar to those of LB4 and having a large nonlinear optical constant; have found that when another alkaline metal is partly substituted for Li in the LB4 crystal, a crystal having a structure which is quite different from that of LB4 and those of known borates is obtainable and that this crystal has a nonlinear optical constant which is superior to that of LB4 and has chemical and mechanical stability comparable to that of LB4; and have completed the present invention.

LB4 is a tetragonal crystal having a P4 mm space group and tetraborates of Na, K, and Rb are triclinic crystals represented by Formula 1, and they are quite different in structure from the orthorhombic crystal of the $P2_12_12_1$ space group which is presented in the present invention:

$$\text{Space Group: } P\bar{1} \qquad \text{Formula 1}$$

The optical nonlinearity of the crystal of the present invention is considered to be a contribution of spiral borate rings of a quite novel structure.

The invention relates to a borate single crystal which is represented by the chemical formula $(A_2O).(B_2O_3)_x$, and which is an orthorhombic crystal belonging to the $P2_12_12_1$, space group, wherein A includes two elements selected from the group consisting of Li, Na, K, Rb, and Cs, and $1.5<x<2.5$ (hereinafter the same).

The borate single crystal which is represented by the chemical formula $(A_2O).(B_2O_3)_x$ and which is an orthorhombic crystal belonging to the $P2_12_12_1$ space group is chemically and mechanically stable, and has nonlinear optical effects, electrooptical effects, and acoustooptical effects.

Regarding the nonlinear optical effects, this crystal has a nonlinear optical constant which is greater than that of LB4.

The crystal of the present invention substantially has a composition in which x=2. defects and substitution of alkaline ions are easily caused in this crystal structure and thus the crystal has a characteristic borate ring structure over a considerably wide range of $1.5<x<2.5$. When x is outside of this range, this structure cannot be maintained.

The invention further relates to a borate single crystal which is a light wavelength-converting crystal represented by the chemical formula $Li_{1.5-a}Cs_{0.5-b}X_{a+b}B_4O_7$ wherein X is Rb, K, or Na, $0<a<1.5$, and $0<b<0.5$.

The light wavelength-converting crystal has a relatively large optical constant and deliquescence resistance. When the subscript a in the crystal is less than 0, Li is abundant and high moisture resistant is achieved. However, the nonlinear optical constant is small and $Li_2B_4O_7$ is formed. Thus, the novel crystal of the invention is not produced. When the subscript b is less than 0, Cs is abundant and a high nonlinear optical constant is achieved. However, moisture resistance is decreased. The other alkaline metal represented by X has an intermediate nature between Li and Cs, in the order of Na, K, and Rb. Thus, a suitable nonlinear optical constant and moisture resistance can be determined by substituting Li or Cs for the alkaline metal.

In addition, the invention relates to a method for growing a borate single crystal comprising weighing and melting predetermined amounts of two borates selected from the group consisting of Li, Na, K, Rb, and Cs, or predetermined amounts of a borate and a carbonate selected from the group together with a predetermined amount of boron oxide; and growing an orthorhombic crystal which is represented by the chemical formula $(A_2O).(B_2O_3)_x$ and which belongs to the $P2_12_12_1$ space group from the melt. The invention also relates to a method for growing a boron-containing light wavelength-converting crystal comprising weighing and melting a predetermined amount of lithium carbonate or lithium borate, a predetermined amount of cesium carbonate, rubidium carbonate, potassium carbonate or sodium carbonate, and a predetermined amount of boron oxide; and growing the boron-containing light wavelength-converting crystal represented by the chemical formula $Li_{1.5-a}Cs_{0.5-b}X_{a+b}B_4O_7$.

The crystal grown by the method of the present invention does not absorb moisture in the atmospheric cooling step and does not become turbid. The resultant crystal does not lose its shape and shows deliquescence resistance.

The invention relates to a laser device characterized in that a borate single crystal which is represented by the chemical formula $(A_2O).(B_2O_3)_x$ and which is an orthorhombic crystal belonging to the $P2_12_12_1$ space group is provided in an optical path of laser light generated in a laser medium, and the borate or single crystal performs light wavelength conversion.

This laser device uses a borate single crystal as a wavelength-converting element, which is chemically and mechanically stable, has relatively large birefringence and a nonlinear optical constant which is larger than that of LB4, and thus enables broad wavelength conversion. In particular, the crystal has high transparency down to an ultraviolet region of 200 nm or less, and is suitable for laser devices which generate ultraviolet light.

The invention further relates to a laser device comprising a borate single crystal represented by the chemical formula $Li_{1.5-a}Cs_{0.5-b}X_{a+b}B_4O_7$ provided in an optical path of laser light generated from a laser medium, in which the borate single crystal performs light wavelength conversion.

When the borate single crystal of the invention is irradiated with laser light generated from a laser medium, laser light having a wavelength which is converted in the single crystal is emitted.

In the chemical formulae in this specification, incidental impurities are ignored.

BEST MODE FOR CARRYING OUT THE INVENTION

Among borate single crystals which are represented by the chemical formula $(A_2O).(B_2O_3)_x$ and which are orthorhombic crystals belonging to the $P2_12_12_1$ space group, the borate single crystal represented by the chemical formula $(LiK_{1-y}O_{1-y/2}).(B_2O_3)_x$ wherein $-0.3<y<0.3$ or the borate single crystal represented by the chemical formula $(LiRb_{1-y}O_{1-y/2}).(B_2O_3)_x$ wherein $-0.3<y<0.3$ is preferable.

In the borate single crystal, $LiKB_4O_7$ of $x=2$ and $y=0$ is an ideal composition, as shown in the analytical result of the crystal structure in Example 1. As the chemical analysis shows, this crystal does not always have the above ideal composition and defects and substitution of alkaline ions are easily caused. Thus, this crystal has a borate ring structure over a considerably broad range ($-0.3<y<0.3$). This structure, however, cannot be maintained if the subscript y deviates from the above range. In the borate single crystal, $LiRb_4O_7$ of $x=2$ and $y=0$ is an ideal composition, as shown in the analytical result of the crystal structure in Example 2. As the chemical analysis shows, this crystal does not always have the above ideal composition and defects and substitution of alkaline ions are easily caused. Thus, this crystal has a borate ring structure over a considerably broad range ($-0.3<y<0.3$). This structure, however, cannot be maintained if the subscript y deviates from the above range.

Figure 1:
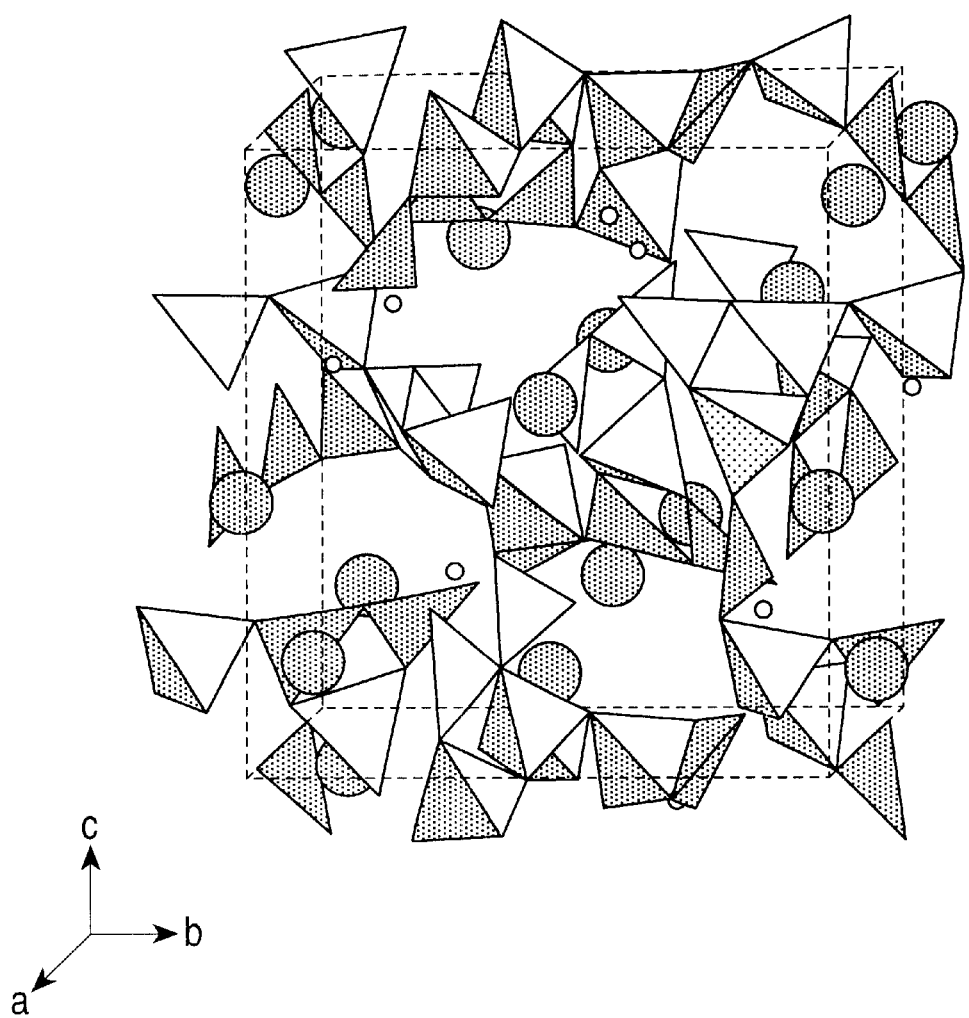
FIG. 1 is a diagram showing the result of structural analysis of a crystal of Example 1.
Figure 2:
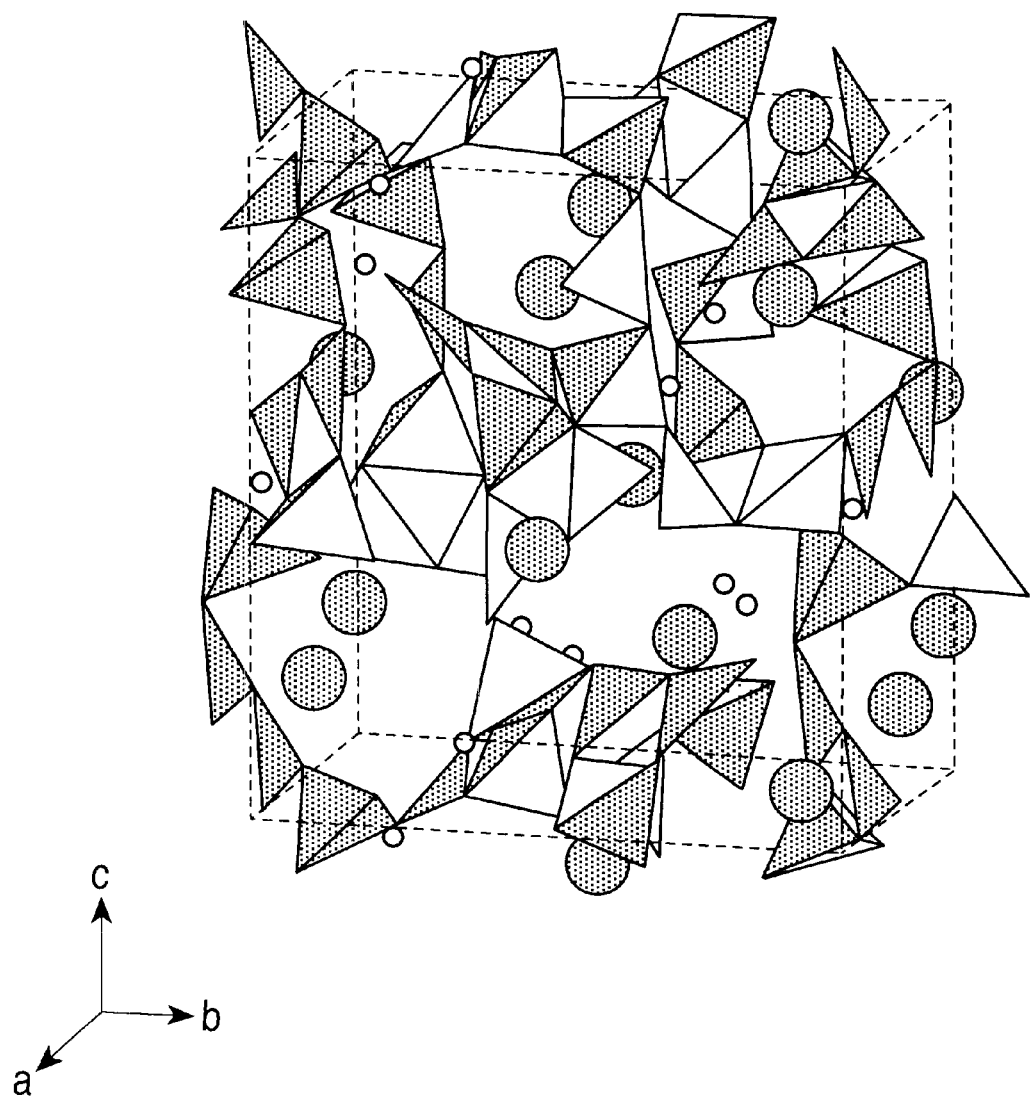
FIG. 2 is a diagram showing the result of structural analysis of a crystal of Example 2.

The borate single crystal having such a composition has spirally connected borate rings. The borate single crystal of the present invention is characterized by spirally connected borate rings as shown in FIG. 1 (Example 1) and FIG. 2 (Example 2). In FIGS. 1 and 2, each tetrahedron represents $BO_4$, each triangle represents $BO_3$, and each small circle represents Li. Each large circle represents K in FIG. 1 and Rb in FIG. 2.

It has been proposed and is being confirmed that nonlinear optical characteristics of borate materials depend on the shape of the borate ring ("Optical Crystals" by Shintaro Miyamoto, pp. 321 to 326, published by Baifakan (1995)). It is generally thought that the more planar the borate ring, the larger the nonlinear optical constant. However, the planar borate ring causes cleavage and poor mechanical properties. Since the borate single crystal of the present invention has spiral borate rings, this borate single crystal shows excellent balance between a medial nonlinear optical constant which is larger than that of LB4 and chemical and mechanical stability. This structure is basically considered to be optimized by the composition represented by $LiKB_4O_7$ or $LiRbB_4O_7$.

As described above, the results of the chemical analysis of the borate single crystal of the present invention do not always show the perfect stoichiometric composition. In particular, LiRbB$_4$O$_7$ of a state in which approximately 3% of Rb atoms are omitted is stable, as suggested by the results of the structural analysis. Thus, considerable ratios of other alkaline metals, such as Cs and Na can be substituted. Although it is difficult to grow a high-quality crystal in such a case, the nonlinear optical constant can be increased. When small amounts (0.05 mole or less per 1 mole of Li) of monovalent cations, such as Tl and Ag, are substituted for alkaline ions, the crystal does not substantially show changes in properties. When the borate single crystal is used as an ultraviolet light converting material, the addition of these ions is not preferable since these ions cause a decrease in transmittance in the ultraviolet region. Consequently, in view of the composition, the crystal provided in the present invention is a material having these characteristics due to the borate ring structure shown in the results (see FIGS. 1 and 2) of the structural analysis of the crystals of Examples 1 and 2, and includes an orthorhombic crystal belonging to the P2$_1$2$_1$2$_1$ space group among the crystals represented by the general formula (A$_2$O).(B$_2$O$_3$)$_x$.

In the borate single crystal, the grown crystal has substantially the congruent composition as that of the melt in the crucible. Thus, an oxide single crystal can be grown by a Czochralski process using a melt prepared by a formulation which is substantially the same as the crystal composition. That is, the single crystal can be grown from a melt having the same composition as that of the single crystal. In one growing method of the present invention, predetermined amounts of two borates (potassium tetraborate and lithium tetraborate in Example 1) selected from the group consisting of Li, Na, K, Rb, and Cs, or predetermined amounts of a borate and a carbonate selected from the group consisting of Li, Na, K, Rb, and Cs together with a predetermined amount of boron oxide are weighed and mixed. The mixture is sintered, is then melted in a crucible, and a single crystal is grown by a Czochralski process. In another method of the present invention, the target single crystal can be grown by controlling the composition of the melt in the crucible with 1.9<x<2.1.

In one growing method according to the invention, predetermined amounts of lithium borate and potassium borate are weighed, a predetermined amount of lithium carbonate or lithium borate, a predetermined amount of potassium borate or potassium carbonate, and a predetermined amount of boron oxide are weighed, or predetermined amounts of lithium carbonate, potassium carbonate, and boron oxide are weighed and mixed by melting. In another growing method according to the invention, predetermined amounts of lithium borate and rubidium borate are weighed, a predetermined amount of lithium carbonate or lithium borate, a predetermined amount of rubidium borate or rubidium carbonate, and a predetermined amount of boron oxide (rubidium carbonate, lithium carbonate, and boron oxide in Example 2) are weighed, or predetermined amounts of lithium carbonate, rubidium carbonate, and boron oxide are weighed and mixed by melting. The mixture is sintered and then is melted in a crucible, and a crystal is grown by a Czochralski process. The target single crystal can be grown by controlling the composition of the melt in the crucible with 1.9<x<2.1 and 0.2<y<0.1.

In a laser device using the borate single crystal grown by the method according to the present invention as a light wavelength-converting crystal, the crystal is chemically and mechanically stable and has a relatively large birefringence and a nonlinear optical constant which is larger than that of LB4, and thus enables broad wavelength conversion.

Although microprocessing is an important application of ultraviolet laser light, in this case, the number of pulses per unit time must be increased in order to improve the processing efficiency. Heating and damage of crystals due to absorption of ultraviolet light are significant problems in practice. The spiral borate ring structure of the crystal of the present invention shows mechanical properties which are stronger than those of conventional crystals such as BBO and LBO. The above borate single crystal has excellent transmittance down to an ultraviolet region of 200 nm or less.

When the above borate single crystal is used in a laser device, it is suitable for a laser device emitting ultraviolet light. In particular, the crystal of the present invention can be used in a laser device which generates pulsed ultraviolet light with a high repetition rate of 1 kHz or more. This laser device can perform laser processing more effectively than conventional ultraviolet laser processing apparatuses.

Starting materials for producing the crystal of the present invention are lithium carbonate or lithium borate, cesium carbonate, rubidium carbonate, potassium carbonate or sodium carbonate, and boron oxide. These are weighed in predetermined amounts and melted by heating to form a melt, and a crystal is grown from the melt. The crystallization temperature of the crystal represented by the chemical formula Li$_{1.5-a}$Cs$_{0.5-b}$X$_{a+b}$B$_4$O$_7$ is 820° C. or less, and the crystal exhibits incongruent melting and can be grown by a method which is similar to a top-seeded solution growth (TSSG) method or a hydrothermal method.

The crystals of the present invention can be used in a laser device as a nonlinear optical material in a single-crystal state. In this laser device, the borate single crystal provided in an optical path of a laser medium is irradiated with laser light having a fundamental wavelength of the laser medium, and the wavelength of the light incident on the single crystal is converted so that harmonic waves are emitted. Thus, the single crystal can be used as a short-wavelength light source. Examples of laser media include dye lasers, solid-states lasers, and semiconductor lasers. The borate single crystal of the present invention is sintered and used as a nonlinear optical material of polycrystalline ceramic so that the ceramic is irradiated with laser light having a wavelength which is longer than the visible region for visualization. For example, when the ceramic is irradiated with laser light of 1.06 μm using YAG, visible light of 0.53 μm is emitted and the beam shape and intensity distribution of the laser light can be observed.

EXAMPLE 1

640 g of potassium tetraborate hydrate (K$_2$B$_4$O$_7$.H$_2$O) was weighed and heated at 650° C. for 10 hours to form potassium tetraborate anhydrate K2B$_4$O$_7$. 360 g of lithium tetraborate anhydrate (Li$_2$B$_4$O$_7$) was added thereto and mixed therewith. The mixture was sintered at 680° C. and melted in a platinum crucible (diameter 70 mm, height approximately 100 mm) at 850° C. The calculated composition of the melt was approximately Li:K:B=0.52:0.48:2 by molar ratio. Using a seed crystal, which was prepared by cutting a crystal grown using a polycrystal as a seed crystal, a single crystal was grown by a Czochralski process. The rotation rate of the seed crystal was 15 rpm and the pulling rate was 0.25 mm/h.

Figure 3:
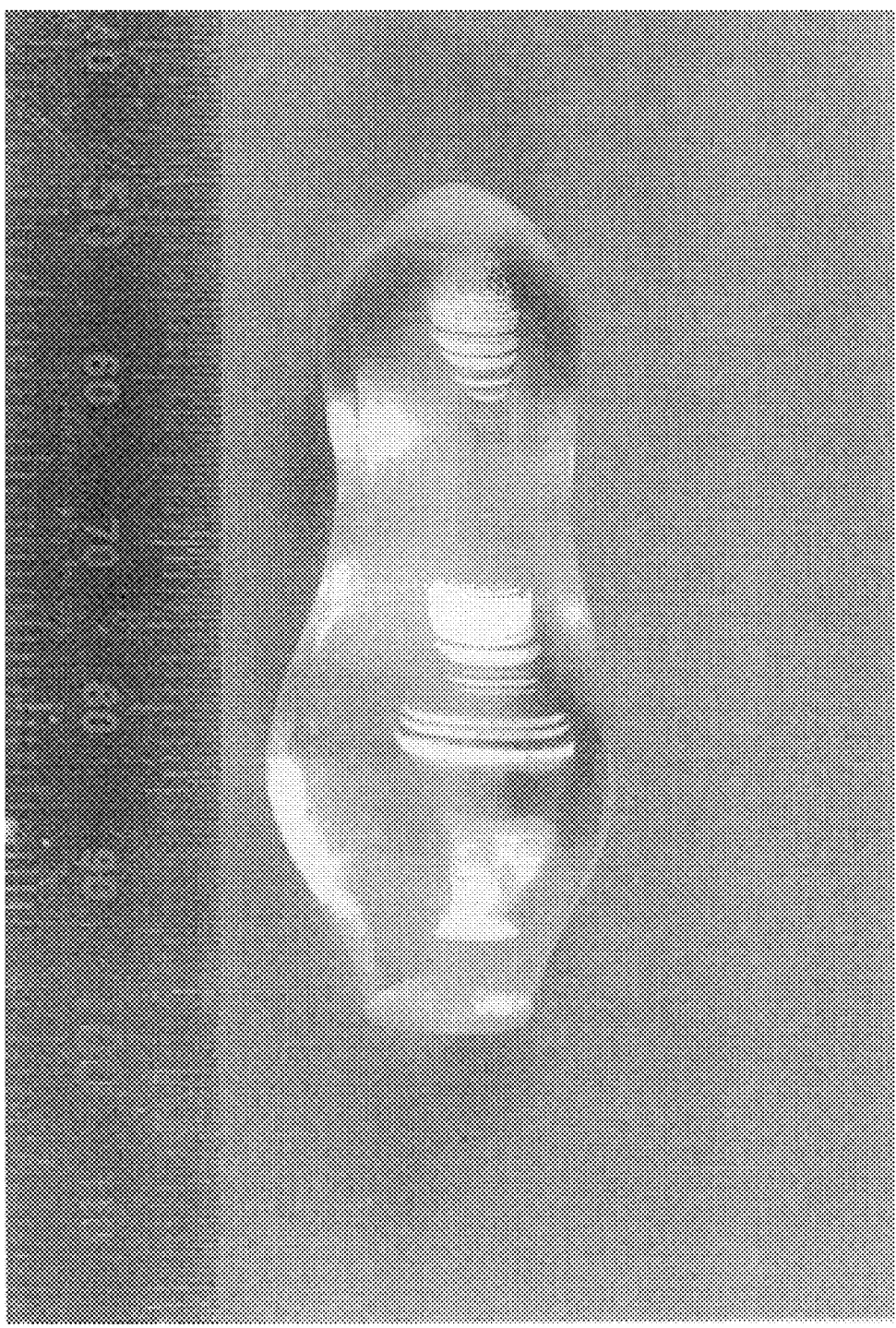
FIG. 3 is a photograph of the crystal of Example 1.

A transparent single crystal was thereby prepared as shown in FIG. 3. A part of the transparent crystal was cut and subjected to structural analysis using a single-crystal structural analysis apparatus (Rigaku AFC-5R). The results of the structural analysis are shown in FIG. 1 and Table 1.

Moreover, the results of chemical analysis of a part of the crystal are shown in Table 3.

TABLE 1

Results of Structural Analysis of Crystal of EXAMPLE 1

| Chemical Formula | LiKB$_4$O$_7$ |
| --- | --- |
| Crystal System | Orthorhombic |
| Space Group | P2$_1$2$_1$2$_1$ |
| Lattice Constants | a = 8.485, b = 11.136, c = 12.646 |

Figure 4:
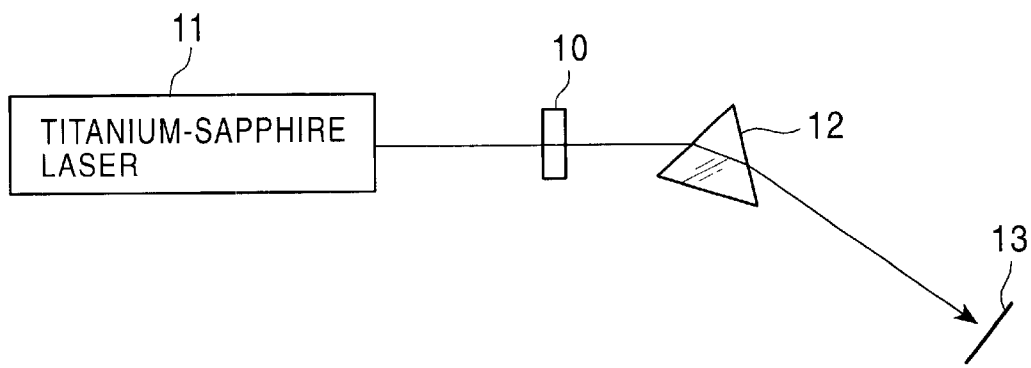
FIG. 4 is a block diagram of an ultraviolet light converting experimental apparatus using the crystals of Examples 1 and 2.

A part (crystal orientation unknown, thickness approximately 2 mm, diameter approximately 10 mm) of the resulting crystal was polished. As shown in FIG. 4, this borate single crystal 10 was irradiated with light from a pulsed titanium-sapphire laser 11 (wavelength 720 to 780 nm, output energy 2 mJ, beam diameter approximately 2 mm, pulse width 8 ns), while the orientation of the crystal was changed. The emitted light was separated by a prism 12 and illuminated fluorescent paper 13 to observe the second harmonic generation. The generation of the SHG light (360 to 390 nm) was confirmed over the entire wavelength range.

Figure 5:
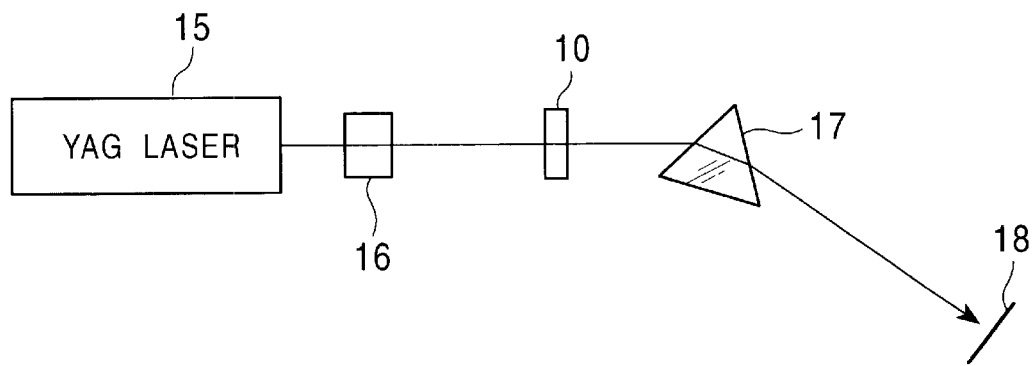
FIG. 5 is a block diagram of another ultraviolet light converting experimental apparatus using the crystal of Example 1.

As shown in FIG. 5, a LBO (LiB3O$_5$) crystal 15 was irradiated with light from a pulsed YAG laser 15 (wavelength 1,064 nm, approximately 3 mJ, pulse width 12 ns) to generate second harmonic waves (wavelength 532 nm, approximately 1.5 mm), while the crystal 10 was irradiated with the second harmonic waves (incident beam diameter approximately 1.5 mm) in the same optical axis. The crystal orientation was changed while the emitted light was separated by a prism 17 and radiated onto a fluorescent paper 18 to visually observe the generation of sum frequency generation (SFG). The generation of ultraviolet light (YAG third harmonic wave at 355 nm) was observed in a specific crystal orientation.

This crystal was experimentally irradiated with pulse YAG laser fourth harmonic waves (wavelength of 266 nm, 1 kHz, 1 mJ) with a diameter of approximately 0.6 mm. After 1 hour of irradiation, no change in the crystal was visually observed, and no significant temperature increase was observed at a side face of the crystal. For comparison, a BBO crystal was subjected to the same experiment, and a temperature increase of 10° C. or more was observed after 10 minutes. Thus, it is assumed that this crystal exhibits superior characteristics up to higher output than the BBO crystal.

Figure 6:
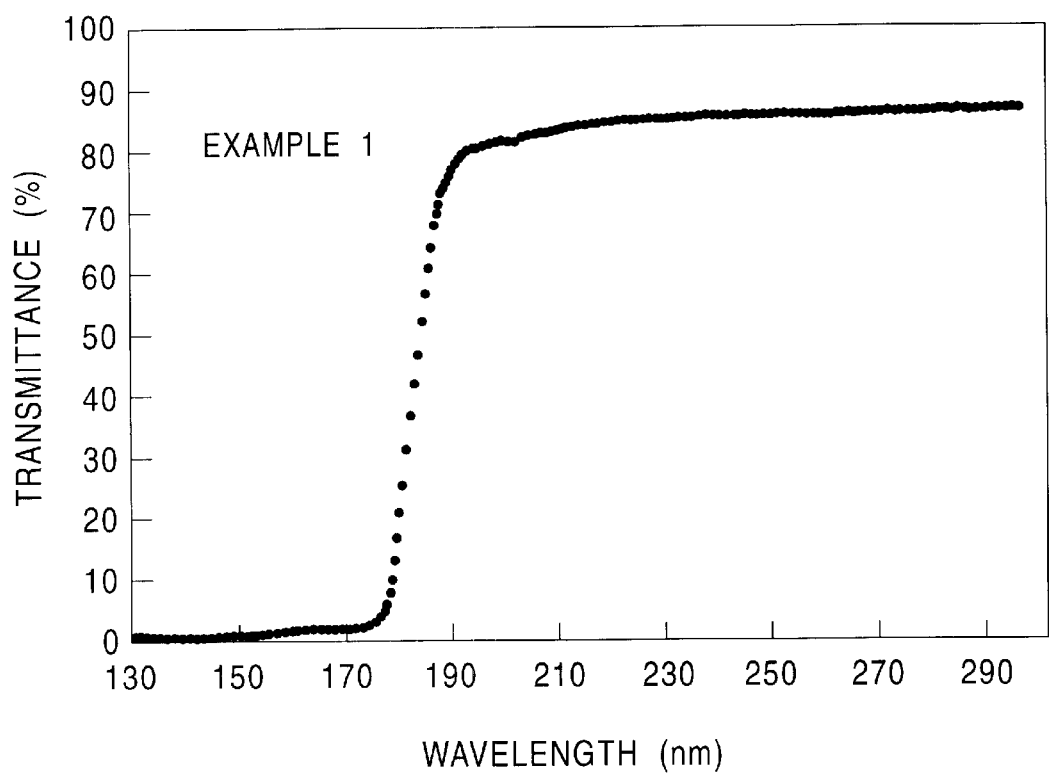
FIG. 6 is an ultraviolet transmission spectrum of the crystal of Example 1.
Figure 7:
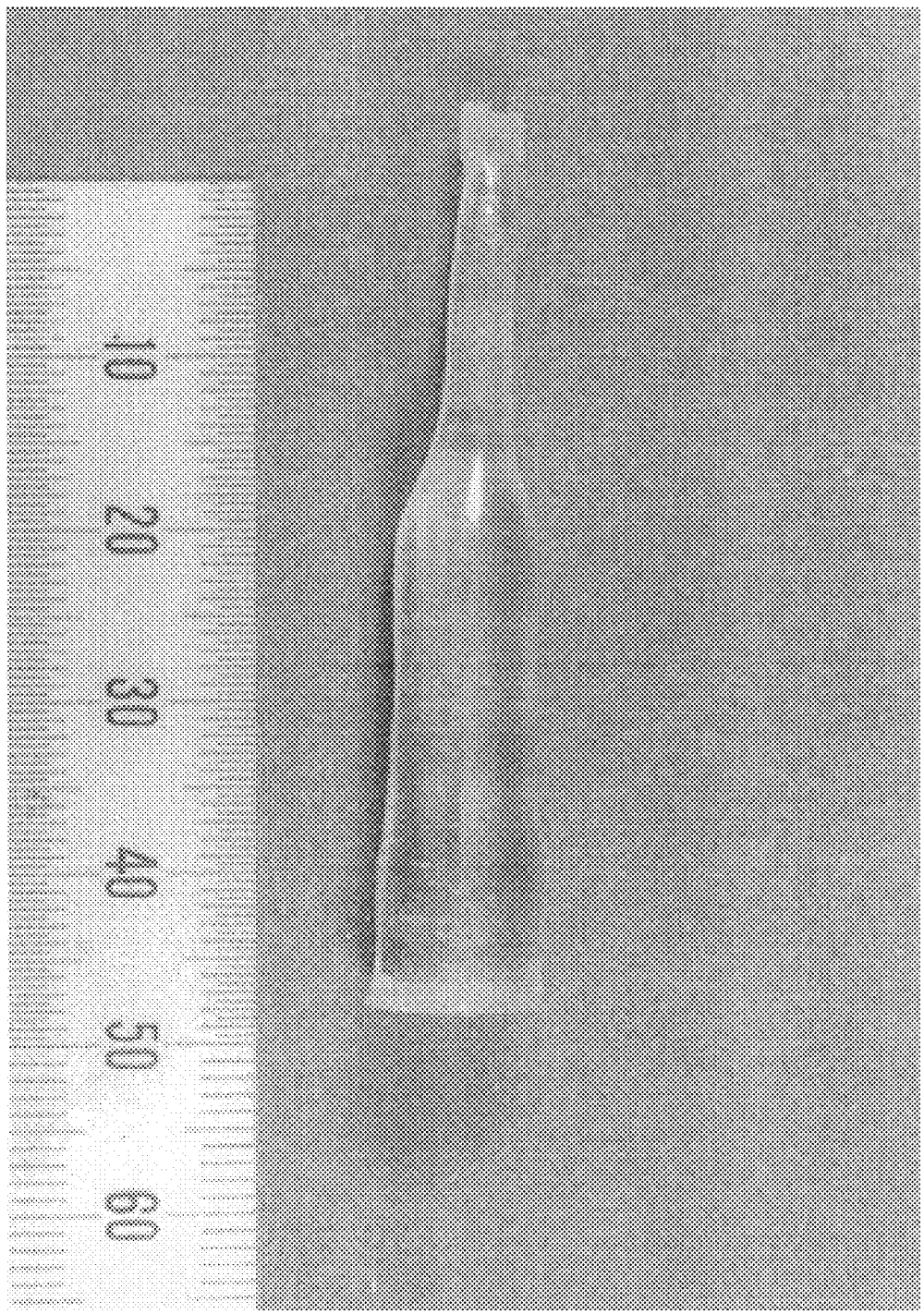
FIG. 7 is a photograph of the crystal of Example 2.

Another part of the crystal was polished to a thickness of approximately 0.3 mm, and ultraviolet transmittance characteristics were measured using a vacuum ultraviolet spectrometer. As shown in FIG. 6, this crystal exhibits excellent transmittance characteristics down to 200 nm or less.

After the crystal was allowed to stand in a room (temperature of 20 to 30° C., humidity of 40 to 80%) for three weeks, changes such as clouding were not observed. Thus, this crystal is assumed to have humidity resistance which is comparable to that of the LB4 crystal. In the cutting and polishing steps, without taking particular attention, deliquescency and cracking did not occur, and excellent mechanical properties were observed.

EXAMPLE 2

960 g of rubidium carbonate (Rb$_2$CO$_3$), 300 g of lithium carbonate (Li$_2$CO$_3$), and 1,160 g of boron oxide (B$_2$O$_3$) were mixed, sintered at 650° C., and melted in a platinum crucible (diameter of 100 mm, height of 100 mm). The calculated composition of the melt was approximately Li:Pb:B=0.49:0.51:2.03 by molar ratio. A single crystal was grown by a Czochralski process using a seed crystal, which was prepared by cutting a crystal grown using a polycrystal as a seed crystal. The rotation rate of the seed crystal was 40 rpm and the pulling rate was 0.2 mm/h.

A transparent single crystal was thereby prepared as shown in the photograph in FIG. 3. A part of the transparent crystal was cut and subjected to structural analysis using a single-crystal structural analysis apparatus (Rigaku AFC-5R). The results of the structural analysis are shown in FIG. 2 and Table 2. Moreover, the results of chemical analysis of a part of the crystal are shown in Table 3.

TABLE 2

Results of Structural Analysis of Crystal of EXAMPLE 2

| Chemical Formula | LiRbB$_4$O$_7$ |
| --- | --- |
| Crystal System | Orthorhombic |
| Space Group | P2$_1$2$_1$2$_1$ |
| Lattice Constants | a = 8.628, b = 11.261, c = 12.857 |

A part (crystal orientation unknown, thickness approximately 2 mm, diameter approximately 20 mm) of the resulting crystal was polished and subjected to the same experiments as in EXAMPLE 1. A condition for generating second harmonic light (360 to 390 nm) over the entire wavelength range of 720 nm to 780 nm was confirmed using a pulsed titanium-sapphire laser.

Figure 8:
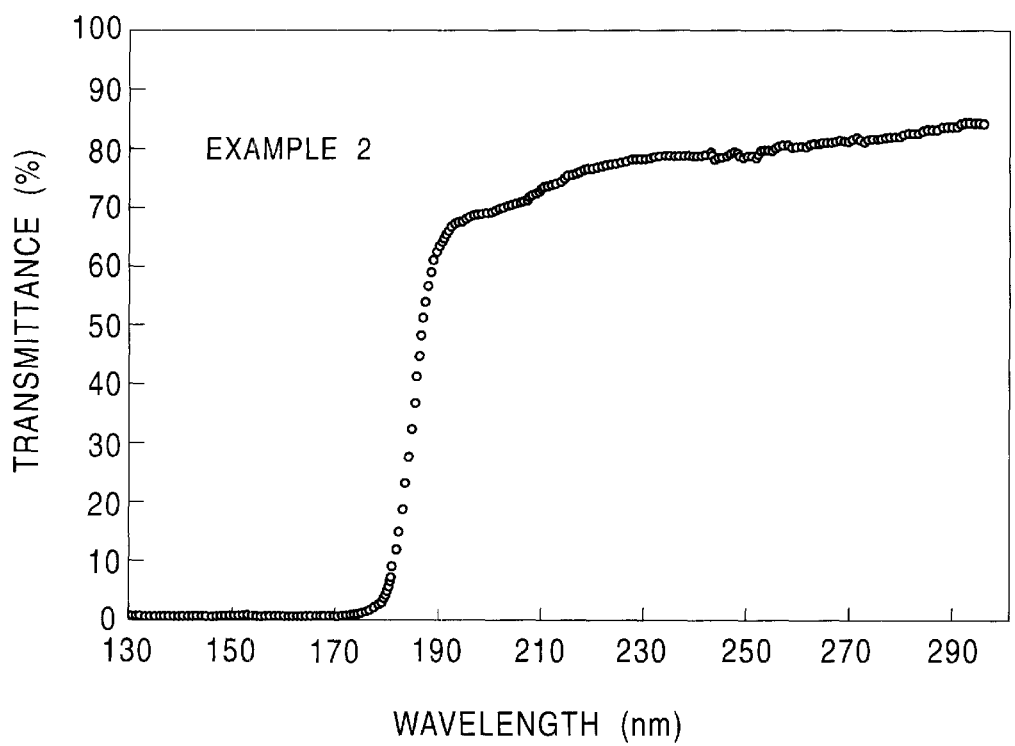
FIG. 8 is an ultraviolet transmission spectrum of the crystal of Example 2.

Another part of the crystal was polished to a thickness of approximately 0.3 mm and ultraviolet transmittance characteristics were measured using a vacuum ultraviolet spectrometer. As shown in FIG. 8, this crystal exhibits excellent transmittance characteristics down to 200 nm or less.

After the crystal was allowed to stand in a room (temperature of 20 to 30° C., humidity of 40 to 80%) for three weeks, change such as clouding were not observed. Thus, this crystal is considered to have humidity resistance which is comparable to that of the LB4 crystal. In the cutting and polishing steps, without taking particular attention, deliquescence and cracking did not occur, and excellent mechanical properties were observed.

TABLE 3

Results of Chemical Analysis of Crystals of EXAMPLES 1 and 2

| | Li | K | Rb | B | x | y |
| --- | --- | --- | --- | --- | --- | --- |
| EXAMPLE 1 | 3.69 | 19.2 | — | 21.4 | 0.08 | 1.93 |
| Stoichiometric Ratio in LiKB$_4$O$_7$ | (3.44) | (19.42) | — | (21.48) | | |
| EXAMPLE 2 | 3.5 | — | 33.0 | 17.8 | 0.24 | 1.73 |
| Stoichiometric Ratio in LiRbB$_4$O$_7$ | (2.8) | — | (34.5) | (17.5) | | |

EXAMPLE 3

Figure 9:
FIG. 9 is a photograph of the crystal of Example 3.

80 g of rubidium carbonate (Rb$_2$CO$_3$), 120 g of cesium carbonate (Cs$_2$CO$_3$), 50 g of lithium carbonate (Li$_2$CO$_3$), and 200 g of boron oxide (B$_2$O$_3$) were mixed, sintered at 550° C., and melted in a platinum crucible (diameter of 40 mm, height of 60 mm). The calculated composition of the melt was approximately Li:Rb:Cs:B=0.97:0.5:0.53:2.06 by molar ratio. A single crystal was grown using a part of the crystal of EXAMPLE 2 as a seed crystal. The rotation rate of the seed crystal was 15 rpm and the pulling rate was 0.1 mm/h. A photograph of the resulting single crystal is shown in FIG. 9. As shown in FIG. 9, the resulting crystal had a partial transparent portion, and this portion was cut off.

The composition of the resultant crystal is shown in Table 4. The transparent portion was pulverized, and the powder was irradiated with pulsed YAG laser light (wavelength of 1,064 nm, beam diameter of 1 mm, 2 mJ, 10 ns), and the generation of green light which was brighter than that of the crystals of EXAMPLES 1 and 2 was observed.

EXAMPLES 4 to 6

In order to prepare a borate single crystal represented by the chemical formula $Li_{1.5-a}Cs_{0.5-b}X_{a+b}B_4O_7$, a carbonate salt selected from sodium carbonate, potassium carbonate, and rubidium carbonate; lithium carbonate; cesium carbonate; and boron oxide were weighed, mixed, and sintered at 600° C. so as to yield a composition (by weight ratio) wherein X was Na (EXAMPLE 4), K (EXAMPLE 5), or Rb (EXAMPLE 6), the subscript a was 1.0 (EXAMPLE 4), 0.3 (EXAMPLE 5), or 0.5 (EXAMPLE 6), and the subscript b was 0 (EXAMPLE 4), 0.2 (EXAMPLE 5), or 0.1 (EXAMPLE 6).

COMPARATIVE EXAMPLE 1

In order to prepare a borate single crystal represented by $Li_{1.6}Cs_{0.4}B_4O_7$, lithium carbonate, cesium carbonate, and boron oxide were weighed so as to have a composition (by weight ratio) shown in Table 4, were mixed, and were sintered at 600° C.

COMPARATIVE EXAMPLE 2

In order to prepare a borate single crystal represented by $Li_{0.5}CsNa_{0.5}B_4O_7$, sodium carbonate, lithium carbonate, cesium carbonate, and boron oxide were weighed so as to have a composition (by weight ratio) shown in Table 4, were mixed, and were sintered at 600° C.

Comparative Evaluation

Sintered compacts of EXAMPLES 4 to 6 and COMPARATIVE EXAMPLES 1 and 2 were irradiated with YAG laser light (wavelength of 1,064 nm), and the generation of second harmonic light (532 nm) from the sintered compacts was visually observed. Each crystal was exposed to the air for two weeks. Deliquescence of the resulting sintered compacts was evaluated by the change in state. The results are shown in Table 4. In the SHG intensity column in Table 4, "AA" indicates the strongest intensity, "A" indicates stronger intensity than that of LB4 (substantially the same as that in EXAMPLES 1 and 2), and "B" indicates substantially the same intensity as that of LB4. In the deliquescence column in Table 4, "A" indicates no apparent change, "B" indicates surface clouding, and "C" indicates a change in the shape.

TABLE 4

Contents of Crystals of EXAMPLES 3 to 6 and COMPARATIVE EXAMPLES 1 and 2

| | Li | Na | K | Rb | Cs | SHG Intensity | Deliquescence |
|---|---|---|---|---|---|---|---|
| EXAMPLE 3 | | | | | | | |
| Formulated composition | 0.97 | — | — | 0.5 | 0.53 | AA | A |
| Analytical Value | 3 | — | — | 16 | 15 | | |
| Analytical Composition | 1.2 | — | — | 0.5 | 0.3 | | |
| EXAMPLE 4 | | | | | | | |
| Formulated Value | 0.5 | 1.0 | — | — | 0.5 | AA | B |
| EXAMPLE 5 | | | | | | | |
| Formulated Value | 1.2 | — | 0.5 | — | 0.3 | A | A |
| EXAMPLE 6 | | | | | | | |
| Formulated Value | 1.0 | — | — | 0.6 | 0.4 | AA | A |
| COMP. EX. 1 | | | | | | | |
| Formulated Value | 1.6 | — | — | — | 0.4 | B | A |
| COMP. EX. 2 | | | | | | | |
| Formulated Value | 0.5 | 0.5 | — | — | 1.0 | AA | C |

COMP. EX.: COMPARATIVE EXAMPLE

Industrial Applicability

As described above, the borate single crystal of the present invention has a novel crystal structure which does not have centrosymmetry and which is transparent over a wide range from the ultraviolet region to the infrared region. When this crystal is used as a light wavelength-converting crystal, the crystal can convert the wavelength of laser light in a chemically and mechanically stable state. When ultraviolet light is generated, this crystal shows superior optical characteristics compared to conventional crystals.

Since an ultraviolet laser using the crystal of the present invention can generate ultraviolet light at high repetition rates, a laser device for processing using this light can perform laser processing more effectively compared to conventional devices.

Since the crystal of the present invention has humidity resistance, the crystal is not degraded when it is exposed to the air. Thus, the crystal can be preferably used not only as light wavelength-converting materials in the ultraviolet region, but also as piezoelectric materials and pyroelectric materials due to the crystal structure thereof.

What is claimed is:

1. A borate single crystal which is represented by the chemical formula $(A_2O) \cdot (B_2O_3)_x$ and which is an orthorhombic crystal belonging to the $P2_1 2_1 2_1$ space group, wherein A includes two elements selected from the group consisting of Li, Na, K, Rb, and Cs, and $1.5 < x < 2.5$.

2. A borate single crystal as a light wavelength-converting crystal represented by the chemical formula $Li_{1.5-a}Cs_{0.5-b}X_{a+b}B_4O_7$ wherein X is Rb, K, or Na, $0 \leq a < 1.5$, and $0 \leq b < 0.5$.

3. A method for growing a borate single crystal comprising: weighing and melting predetermined amounts of two borates selected from the group consisting of Li, Na, K, Rb, and Cs, or predetermined amounts of a borate and a carbonate selected from said group together with a predetermined amount of boron oxide; and growing an orthorhombic crystal which is represented by the chemical formula $(A_2O) \cdot (B_2O_3)_x$ and which belongs to the $P2_1 2_1 2_1$ space group from the melt;

wherein A includes two elements selected from the group consisting of Li, Na, K, Rb, and Cs, and $1.5 < x < 2.5$.

4. A method for growing a borate single crystal comprising: weighing and melting a predetermined amount of lithium carbonate or lithium borate, a predetermined amount of cesium carbonate, a predetermined amount of rubidium carbonate, potassium carbonate or sodium carbonate, and a predetermined amount of boron oxide; and growing a light wavelength-converting crystal represented by the chemical formula $Li_{1.5-a}Cs_{0.5-b}X_{a+b}B_4O_7$ wherein X is Rb, K, or Na, $0 \leq a < 1.5$, and $0 \leq b < 0.5$.

5. A laser device characterized in that a borate single crystal which is represented by the chemical formula $(A_2O) \cdot (B_2O_3)_x$ and which is an orthorhombic crystal belonging to the $P2_12_12_1$ space group is provided in an optical path of laser light generated in a laser medium, and the borate single crystal performs light wavelength conversion;

wherein A includes two elements selected from the group consisting of Li, Na, K, Rb, and Cs, and $1.5 < x < 2.5$.

6. A laser device comprising a borate single crystal represented by the chemical formula $Li_{1.5-a}Cs_{0.5-b}X_{a+b}B_4O_7$ provided in an optical path of laser light generated from a laser medium, the borate single crystal performing light wavelength conversion, wherein X is Rb, K, or Na, $0 < a < 1.5$, and $0 < b < 0.5$.

7. A borate single crystal, which is represented by the chemical formula $(LiA_{1-y}O_{1-y/2}) \cdot (B_2O_3)_x$;

wherein said crystal is an orthorhombic crystal belonging to the $P2_12_12_1$ space group;

wherein

A is K or Rb;

$1.5 < x < 2.5$; and $-0.3 < y < 0.3$.

8. A method for growing a borate single crystal, comprising:

weighing and melting predetermined amounts of one of 1), 2) or 3):

1) a predetermined amount of a) lithium borate and b) potassium borate or rubidium borate; or 2) a) a predetermined amount of lithium carbonate or lithium borate, and b) a predetermined amount of potassium borate or potassium carbonate or rubidium borate or rubidium carbonate, and c) a predetermined amount of boron oxide; or 3) predetermined amounts of a) lithium carbonate, b) potassium carbonate or rubidium carbonate, and c) boron oxide, thereby obtaining a melt; and growing from the melt an orthorhombic crystal which is represented by the chemical formula $(LiA_{1-y}O_{1-y/2}) \cdot (B_2O_3)$, and which belongs to the $P2_12_12_1$ space group;

wherein

A is K or Rb;

$1.5 < x < 2.5$; and $-0.3 < y < 0.3$.

9. A laser device, comprising:

a light wavelength-converting borate single crystal which is represented by the chemical formula $(LiA_{1-y}O_{1-y/2}) \cdot (B_2O_3)_x$ and which is an orthorhombic crystal belonging to the $P2_12_12_1$ space group;

wherein said borate single crystal is provided in an optical path of laser light generated in a laser medium;

wherein

A is K or Rb;

$1.5 < x < 2.5$; and $-0.3 < y < 0.3$.

10. A laser device according to claim 5, wherein the borate single crystal is provided in an optical path of laser light generated in a laser medium so that the borate single crystal emits ultraviolet light.

11. The laser device according to claim 5, wherein the borate single crystal generates pulsed ultraviolet light of 1 kHz or more.

12. A processing apparatus, comprising:

the laser device according to claim 11; and a prism.

* * * * *